United States Patent [19]

Fisher, Jr.

[11] Patent Number: 4,872,799
[45] Date of Patent: Oct. 10, 1989

[54] BOAT TRANSFER AND QUEUING FURNACE ELEVATOR AND METHOD

[75] Inventor: Daniel J. Fisher, Jr., Chelmsford, Mass.

[73] Assignee: BTU Engineering Corporation, North Billerica, Mass.

[21] Appl. No.: 65,182

[22] Filed: Jun. 16, 1987

Related U.S. Application Data

[63] Continuation of Ser. No. 734,919, May 16, 1985, abandoned.

[51] Int. Cl.⁴ .......................... B65G 25/00; F27D 3/00
[52] U.S. Cl. ..................................................... 414/180
[58] Field of Search ............... 414/180, 267, 277, 181, 414/182; 901/16, 17, 21; 74/479, 840; 432/5, 6, 152

[56] References Cited

U.S. PATENT DOCUMENTS

| | | | | |
|---|---|---|---|---|
| 990,205 | 4/1911 | Britton | ..................................... | 74/840 |
| 1,383,041 | 6/1921 | Verdy | ..................................... | 74/840 |
| 3,212,649 | 10/1965 | Johnson et al. | ..................... | 901/21 X |
| 3,665,148 | 5/1972 | Yasenchak et al. | ............... | 901/16 X |
| 3,782,565 | 1/1974 | Doran et al. | ...................... | 414/277 X |
| 3,883,008 | 5/1975 | Castaldi | ............................ | 414/269 X |
| 3,934,481 | 1/1976 | Foster | ................................. | 74/194 X |
| 4,075,972 | 2/1978 | Yamawaki et al. | ............... | 414/152 X |
| 4,358,239 | 11/1982 | Dechantsreiter | ............... | 414/282 X |
| 4,439,146 | 3/1984 | Sugita | ................................. | 432/6 X |
| 4,468,195 | 8/1984 | Sasaki et al. | ...................... | 414/180 X |
| 4,505,630 | 3/1985 | Kaschner et al. | ............... | 414/180 X |
| 4,507,044 | 3/1985 | Hutchins et al. | ................ | 414/744 R |
| 4,543,059 | 9/1985 | Whang et al. | ................... | 414/182 X |

Primary Examiner—David A. Bucci
Attorney, Agent, or Firm—Weingarten, Schurgin, Gagnebin & Hayes

[57] ABSTRACT

A novel boat transfer and queuing furnace elevator and method includes an X, Z, and Y assembly movable between furnace processing tubes, a furnace loading island, and an operator work station. The X, Z, and Y assembly includes X, Z, and Y drive motors mounted in a region below the region defined by the operative transfer, queuing, loading, and unloading movement paths for preventing motor-produced pollutants from contaminating wafer-loaded boats. The X, Z, and Y assembly includes X, Z, and Y linkages having resilient members mounted along moving and mounting interfaces thereof for providing shock and vibration isolation. In one embodiment, the work station and furnace are arranged in-line, and in another embodiment the work station and furnace are arranged in laterally offset relation. In both embodiments, the X, Z, and Y assembly has a multi-mode operation capability that minimizes "dead time" between transfers and significantly improves system processing throughput.

5 Claims, 9 Drawing Sheets

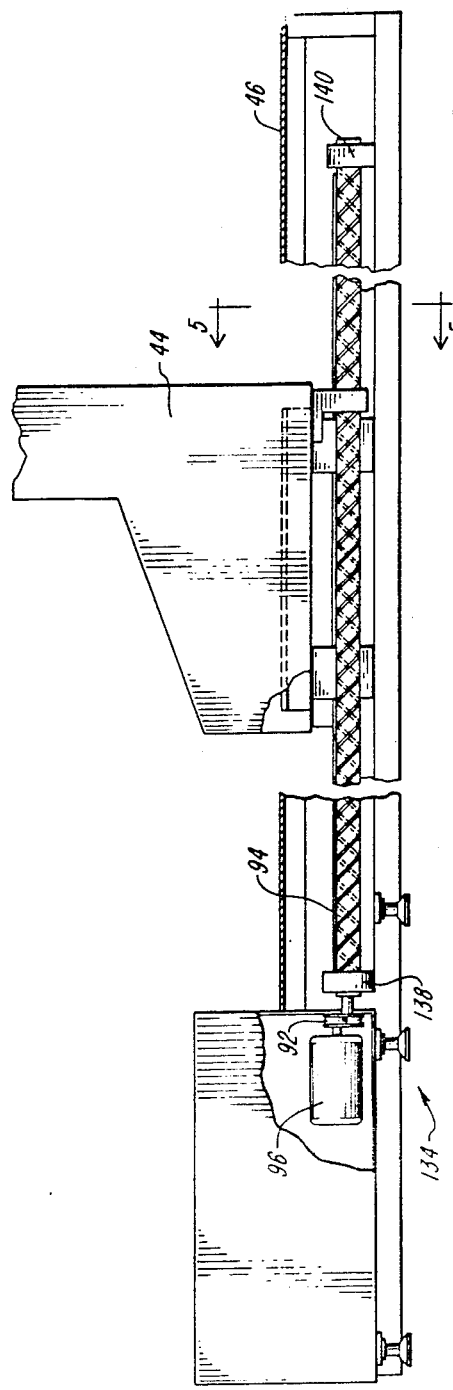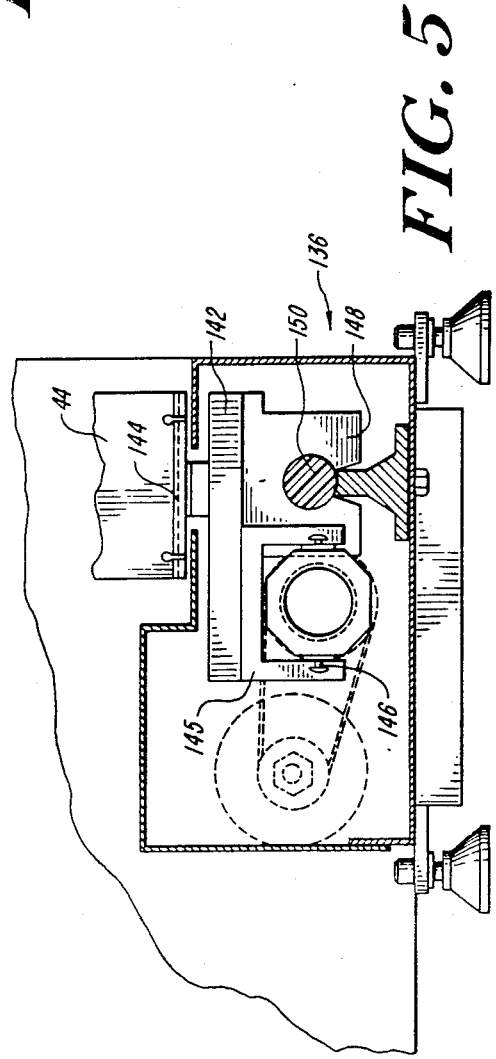

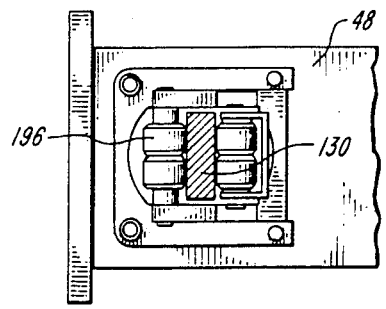
FIG. 9
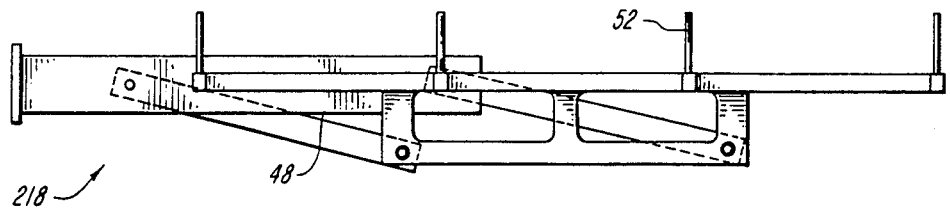
FIG. 11B
FIG. 11A
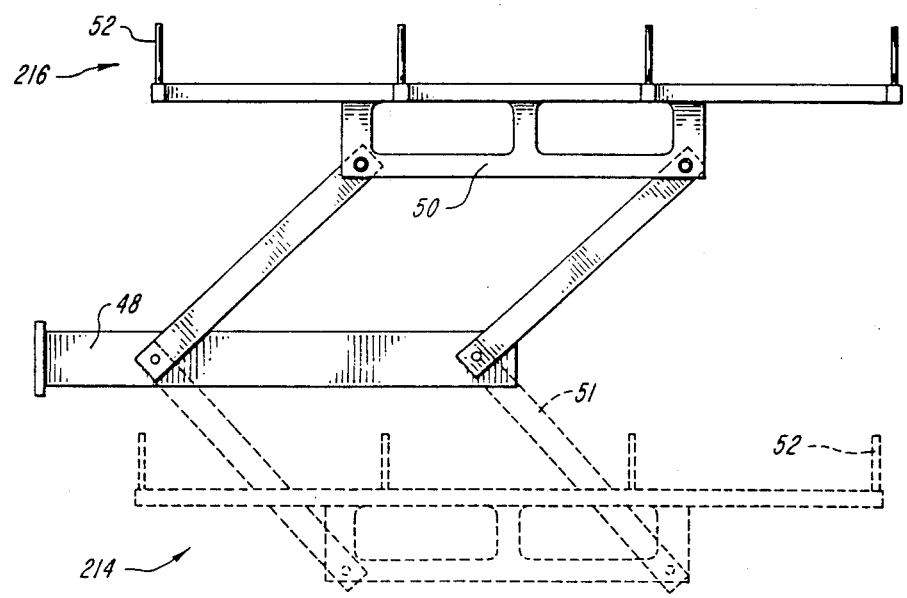

BOAT TRANSFER AND QUEUING FURNACE ELEVATOR AND METHOD

This application is a continuation, of application Ser. No. 734,919, filed May 16, 1985, now abandoned.

FIELD OF THE INVENTION

The instant invention is directed to the field of article handling, and more particularly, to a novel boat transfer and queuing furnace elevator and method.

BACKGROUND OF THE INVENTION

The quality control and production processes typically employed by the semiconductor production industry often include as an integral part of the microfabrication process the formation of intended thin-film on semiconductor substrates. The semiconductor substrates typically are in the form of wafers to be coated, and are loaded in quartz boats that are removably inserted into a depositing furnace. Reactants in gas phase are injected into the furance and are catalyzed by the surface of the semiconductor wafers to deposit as a thin-film thereon. After thin-film formation the wafers are withdrawn from the furnace and the same or another reaction is performed on the same or another batch of semiconductor wafers.

The dimensions and other characteristics of the thin-film and of the intended device to be fabricated thereby are often such that any particulates or other pollution generated in the coating process can ruin the batch of wafers. A high degree of cleanliness is thus required in handling the wafers to circumvent and minimize the contamination problem.

The boats in which the semiconductor substrates are loaded are typically fabricated of quartz or other refractory material, and the substrates themselves are constituted as thin wafers of silicon or other fragile semiconductor materials. The quartzware boats and wafers loaded therein thus require precision handling to avoid any movement-induced damage such as unintended quartzware and/or substrate chipping, breaking, and the like.

The processing time throughput of the thin-film forming processes is determined by the boat to furnace transfer times during loading and unloading. Revenue generation in the use of the furnace depends upon the system throughput time. Thin-film deposition systems are thus called upon to minimize the "dead time" between batches of wafer-loaded boats to be coated and in such a way as to readily accommodate the requirements of anyone of several run-time deposition processes.

It is thus desirable to provide a boat transfer and queuing furnace elevator and method that is at once free of unacceptably high pollution generation, sufficiently controlled to resist undesirable breakage during transfer, and fast and flexible enough to maximize revenue generation in a manner that readily allows the implementation of any one of several run-time deposition reactions.

SUMMARY OF THE INVENTION

The boat transfer and queuing furnace elevator and method of the present invention includes a work station having plural vertically-oriented shelves spaced from plural vertically-oriented thin-film forming processing tubes. The vertically stacked shelves of the work station severally define loading, unloading, and transfer queuing locations. An elevator having an X, Z, and Y movable boat receiving arm is operable to load and unload boats into and out of any one of the vertically stacked, processing tubes onto and off of any one of the transfer and queuing shelves of the vertical transfer and queuing work station array.

The wafer-loaded boats are controllably placed on different ones of the transfer and loading/unloading shelves and sequentially moved into and out of the several furnace tubes in one of several operator-selectable modes that significantly enhance system processing throughput. The X, Z, and Y movable boat receiving arm includes X, Z and Y drive motors physically mounted lower than the lowest one of the processing tubes that are operatively coupled to the boat receiving arm by corresponding X, Z, and Y linkages so that any motor-produced pollutants are generated in a region below the wafer-loaded boats and processing tubes which minimizes particulate contamination of the wafers. Rubber bushings, pads, and other resilient couplings are incorporated into the moving interfaces of the X, Z, and Y linkages to minimize vibration and shock which acts to help preserve the physical integrity of the quartzware and wafers.

In one embodiment, the work station vertical transfer and queuing shelf array is positioned in-line with the processing tubes of the diffusion furnace. In another embodiment, it is positioned in laterally-offset relation thereto which better conserves clean-room real estate usage. In both embodiments, the wafer-loaded boats are preferably mounted in an intermediate carrier. The elevator is selectively operable in a load-to-tube mode, a load-to-queue mode, a queue-to-tube mode, a tube-to-unload mode, a recall-from-queue mode, and a pause-after-unload mode. The boat transfer and queuing elevator and method of the present invention has been found to controllably move the wafer-loaded boats without any movement-induced breakage, with very low levels of pollutant generation, and with such a processing "dead-time" that significantly enhances system processing throughput and consequent revenue generation.

BRIEF DESCRIPTION OF THE DRAWINGS

These and other features of the present invention will become apparent as the invention becomes better understood by referring to the following solely exemplary description of a preferred embodiment thereof, and to the drawings, wherein:

FIG. 4 is a fragmentary, partially pictorial elevational view illustrating the X drive motor and linkage of the boat transfer and queuing furnace elevator and method according to the present invention;

FIG. 5 is a fragmentary, sectional view along the line 5—5 of FIG. 4;

FIG. 9 is a sectional view illustrating a portion of the Y assembly of the boat transfer and queuing furnace elevator and method according to the present invention;

FIG. 11 is a pictorial view illustrating in FIG. 11A two positions of and illustrating in FIG. 11B another position of the Y assembly of the boat transfer and queuing furnace elevator and method according to the present invention;

DETAILED DESCRIPTION OF A PREFERRED EMBODIMENT

Figure 1:
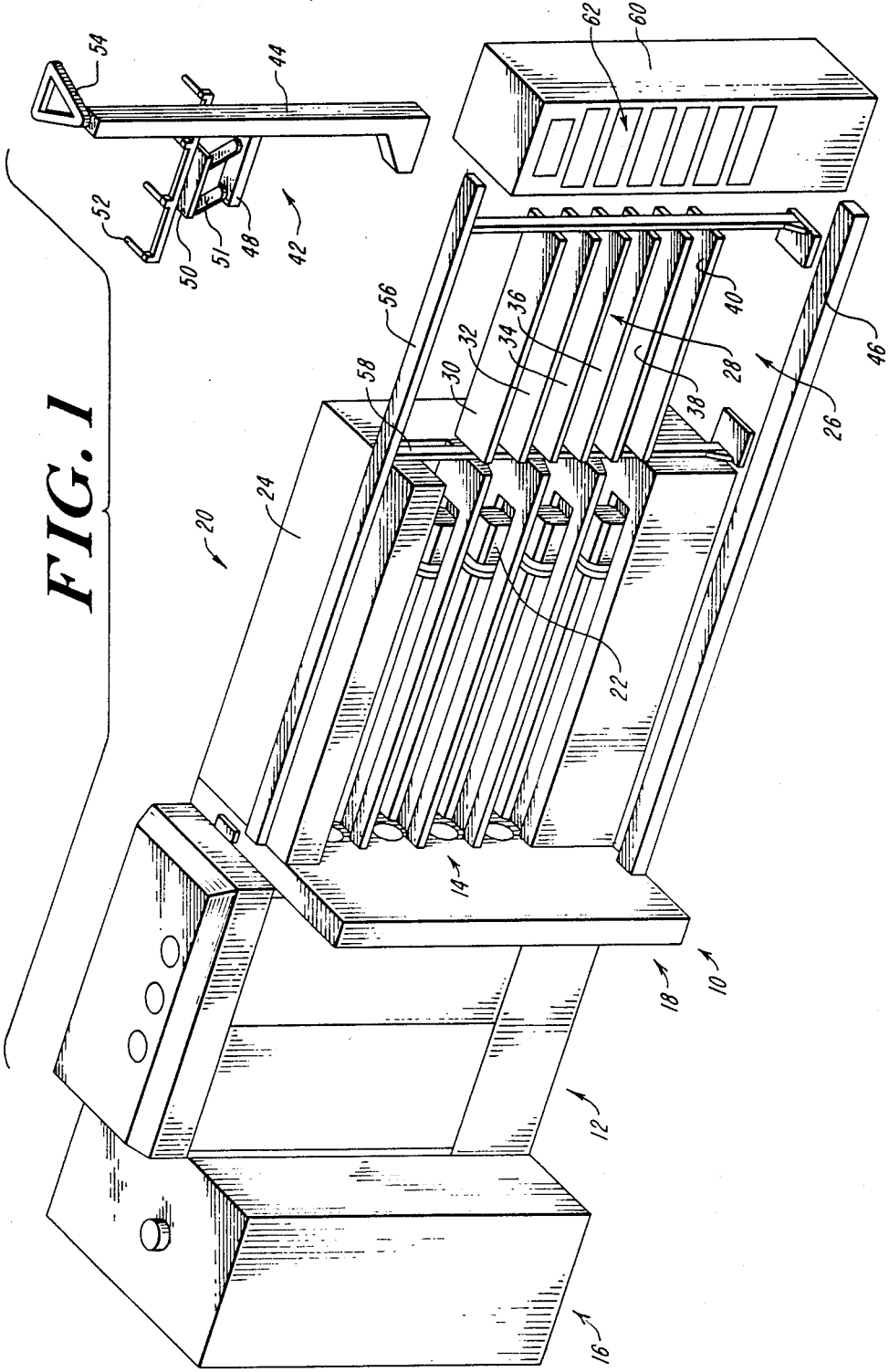
FIG. 1 is an isometric view illustrating one embodiment of the boat transfer and queuing furnace elevator and method according to the present invention.

Referring now to FIG. 1, generally designated at 10 is an isometric view illustrating one embodiment of a novel boat transfer and queuing furnace elevator according to the present invention. A furnace generally designated 12 has a plurality, preferably four, of elongated and horizontally extending processing tubes generally designated 14 that are arrayed in a vertical stack. An input gas manifold generally designated 16 is mounted to the rear of the furnace 12 for injecting reactant in gas phase into the several processing tubes 14, and a scavenger manifold generally designated 18 is mounted to the front of the furnace 12 for establishing an intended atmospheric condition along regions of the processing tubes 14 defined adjacent their mouths. The temperature of, and the type and quantity of the reactants in gas phase injected into, corresponding ones of the processing tubes 14 are determined by the particular process being run on a batch of semiconductor wafers as will be readily appreciated by those skilled in the art.

A loading island generally designated 20 is mounted to the front of the furnace 12. The load island has plural boat loading mechanisms 22, preferably four, one for each of the processing tubes 14. The boat loading mechanisms 22 are axially aligned with the corresponding axis of the processing tubes 14 and preferably include a cantilevered paddle, not shown, for loading and unloading wafer-loaded boats into and out of the corresponding processing tube. Other boat-loading mechanisms such as wheel barrows and the like can be employed as well without departing from the inventive concept. The load island 20 has a laminar flow hood 24 that directs a horizontal cleansing stream transversely past each of the boat loaders 22 to help prevent particulate and other contamination of the wafer-loaded boats controllably positioned on the boat loading mechanisms 22.

An operator work station generally designated 26 is mounted in front of the load island 20. The operator work station 26 includes a plurality of longitudinally extending and vertically stacked shelves generally designated 28 disposed in-line with and vertically displaced from the longitudinal axis of the processing tubes. The shelves 28 define transfer and queuing locations for holding wafers to be processed and for receiving wafers after processing. The wafers are arrayed in side-to-side spaced-apart relation in quartz boats provided therefor, and the quartz boats are preferably carried in an intermediate carrier to be described.

The top four shelves 30, 32, 34, and 36 of the work station 26 define intermediate transfer locations for the intermediate carriers depending on the particular mode of system operation to be described. The next to bottom shelf 38 preferably defines a load location, and the bottom shelf 40 thereof preferably defines an unload location. The load and unload shelves 38, 40 are located adjacent the bottom of the work station 28 to allow a system operator to easily place and remove thereon and therefrom intermediate carriers having wafer-loaded boats to be processed and after processing. It is preferred that the load shelf be superjacent the unload shelf since it is desirable to preserve the cleanliness of the wafer-loaded boats to be processed. The characteristics of the clean room are such that the closer to the floor the greater is the possibility of contamination.

An X, Z, and Y movable elevator generally designated 42 to be described is mounted in laterally-spaced relation to the longitudinal axis of the processing tubes for translation horizontally along a X axis defined between the furnace 12 and the work station 28, for vertical translation along a Z axis defined vertically between the lowest and highest shelf locations, and for lateral translation along a Y axis defined orthogonally to the X and Z axes for loading and unloading wafer-loaded boats onto and off to selected shelves and boat loading mechanisms.

The elevator 42 includes an upstanding tower 44 mounted at its base on a longitudinally extending X drive and guide assembly 46 to be described for controlled translation along the X axis. A longitudinally extending bar 48 is mounted to the tower 44 via a Z drive assembly to be described for controlled translation up and down the length of the tower 44. A frame 50 having extending carrier engaging fingers 52 is pivotally mounted via swing arms 51 to the arm 48, and a lateral Y drive assembly to be described is coupled to the arm 48, arms 51, and tower 44 for controlling the translation of the fingers 52 towards and away from the work station 28 and load island 20. The arm 48, frame 50, swing arms 51, and fingers 52 can also be mounted to the right of the tower 44, not illustrated, for operation as a right-handed elevator assembly.

A triangular-shaped strut 54 is slidably mounted in a top slide and guide rail 56 for stabilizing the top of the column 44 of the elevator 42. The rail 56 is fastened to the top of the load island 24 and is supported on upstanding spaced posts 58 to which the ends of the shelves of the work station 28 are severally mounted.

A control cabinet 60 having operator-accessible controls generally designated schematically at 62 is positioned in-line with the load island 24 and work station 28 to allow either manual or semi-automatic control of the boat transfer and queuing furnace elevator. It will of course be appreciated that the control cabinet 60 can be located in any other suitable location without departing from the inventive concept.

Figure 2:
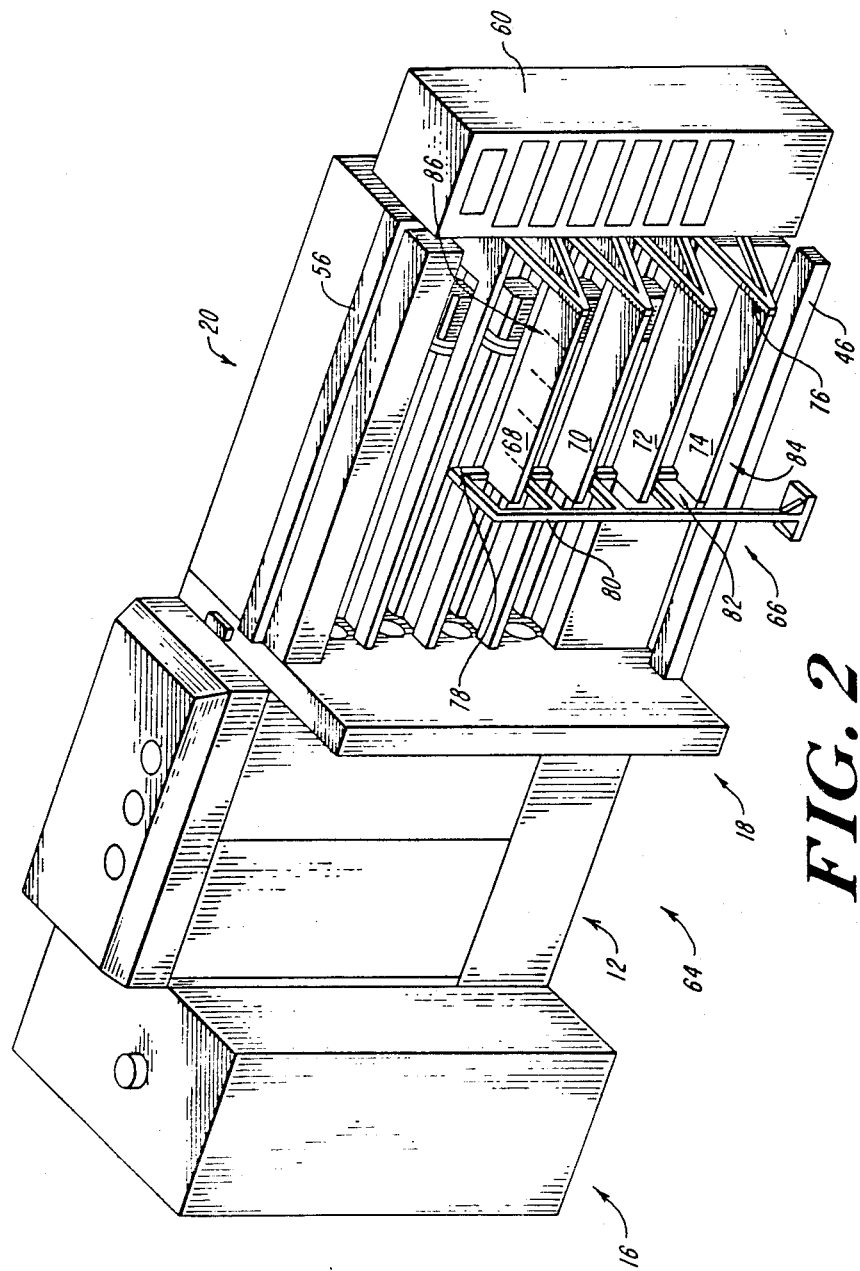
FIG. 2 is an isometric view illustrating a second embodiment of the boat transfer and queuing furnace elevator and method according to the present invention.

Referring now to FIG. 2, generally designated at 64 is an isometric view illustrating another embodiment of the novel boat transfer and queuing furnace elevator according to the present invention. The embodiment of FIG. 2 includes a furnace generally designated 12, a reactant gas input manifold generally designated 16, a scavenger manifold generally designated 18, a load island generally designated 20, and a control cabinet 60 like in the embodiment of FIG. 1. The FIG. 2 embodiment differs from the embodiment of FIG. 1 in three principal respects. First, the location of the work station generally designated 66 is laterally offset and confronting the load island 20. Second, the work station has fewer shelves that individually are aligned with a corresponding one of the processing tubes. Third, the movement of the elevator is different to accommodate the different location and shelf alignment of the work station. The laterally offset location of the work station 66 in confronting relation to the loading island 20 conserves clean-room real estate usage. An elevator substantially identical to the elevator 42 of FIG. 1, not illustrated, is similarly mounted for controlled motion on the bottom drive and guide assembly 46 and on the top slide and guide rail 56.

The work station 66 includes plural shelves, preferably four, in vertically stacked relation. The top two shelves 68, 70 define intermediate transfer locations. The next to bottom shelf 72 defines a load location, and the bottom most shelf 74 defines an unload location. Each of the shelves 68 - 74 are supported on their ends remote from the furnace 12 on cantilevered tie rods generally designated 76. On their other ends, each of the shelves are supported by angle brackets generally designated 78 fastened to an upstanding support post 80. The angle brackets 78 are fastened to the upstanding post 80 in vertically offset relation to the plane defined by the corresponding shelves 68 - 74 so as to provide an elevator lateral arm assembly receiving clearance generally designated 82 above each of the shelves and to provide an elevator lateral arm assembly receiving clearance generally designated 84 below each of the shelves. A plurality of slots schematically illustrated in dashed lines generally designated 86 equal in number to the number of fingers 52 of the elevator 42 (FIG. 1) are provided in each of the several shelves. The clearances 82, 84 and the slots 86 allow loading, unloading, and transfer movement between the work station and processing tubes of the furnace 12 in a manner to be described.

Figure 3:
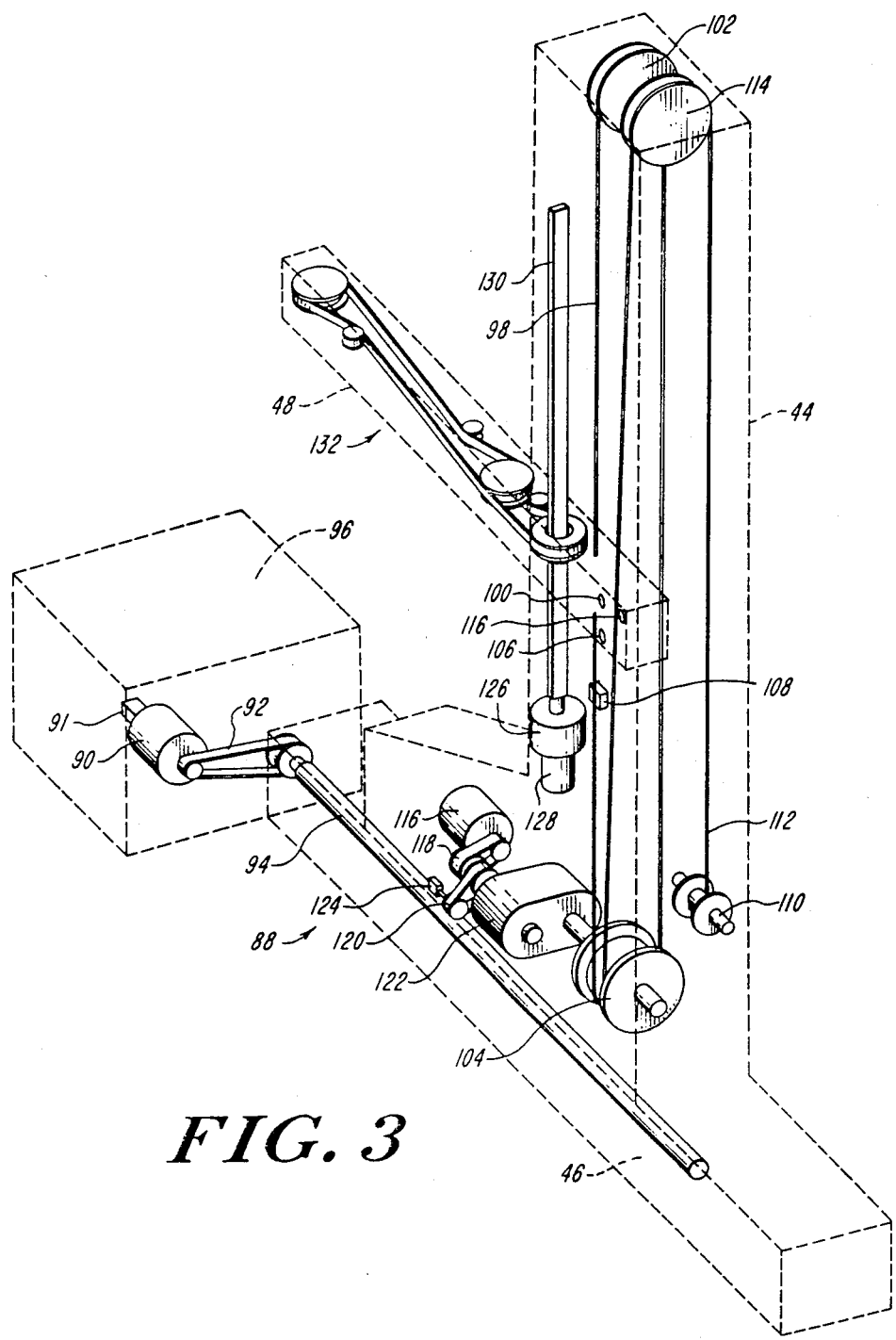
FIG. 3 is a perspective view of the X, Z, and Y drive motors and corresponding linkages of the boat transfer and queuing furnace elevator and method according to the present invention.

Referring now to FIG. 3, generally designated at 88 is a fragmentary perspective view illustrating the arrangement and cooperation of the several drive assemblies and linkages of the boat transfer and queuing furnace elevator according to the present invention. An X drive motor 90 and optical shaft encoder 91 is coupled via a belt 92 to an axially extending threaded shaft 94 mounted within the lower drive and guide assembly 46. The motor 90 is mounted in a cabinet 96 that is disposed below the operative wafer transfer and loading area. The tower 44 is resiliently mounted to the shaft 94 via a screw follower and linear bearing arrangement both to be described for controlled motion along the X axis. The arm 48 is mounted for controlled motion along the Z axis preferably on a support cable 98. The cable 98 is fastened as by a rivet 100 to the inner end of the arm 48 and is wrapped over a pulley 102 journaled at the top of the tower 44 to a drum 104 journaled at the bottom of the tower 44. The cable 98 is fastened at its other end as by rivets 106 to the arm 48. A resilient coupling 108 is provided between the fastening point 106 and the bottom drum 104 to maintain the support cable 98 taught. A spring-reel-counter-balance 110 is journaled in the tower 44 and a cable 112 is wrapped over a pulley 114 journaled at the top of the tower 44 and fastened to the inner end of the arm 48 as by rivet 116. The cable 112 and cooperative pulley 114 and spring-reel 110 provide dead-weight relief for the arm 48.

A Z drive motor 116 is coupled via timing belts 118, 120 to a worm gear arrangement 122 the shaft of which drives the drum 104. An encoder 124 preferably of the rotary type is responsive to the angular rotation of the timing belt 120 to provide a signal indication of the position of the arm 48 along the Z axis. The Z drive motor 116 is mounted at the base of the tower 44 such that during its operation any pollutant generation therefrom remains below the operative working regions to minimize the contamination problem.

A Y drive motor 126 having an encoder preferably of the rotary type 128 responsive to the angular orientation of its shaft is likewise mounted low in the tower 44. An upstanding flat bar 130 is mounted for rotation with the shaft of the motor 126. The arm 48 is mounted for sliding motion along the flat bar 150 via a coupling to be described. The rotation of the flat bar 130 is converted into controlled lateral movement of the fingers 52 (FIG. 1) via a pulley and belt assembly generally designated 132 described more fully below.

Referring now to FIGS. 4 and 5, respectively designated generally at 134 in FIG. 4 is a fragmentary elevational view and generally designated at 136 in FIG. 5 is a sectional view illustrating the X drive assembly of the boat transfer and queuing furnace elevator according to the present invention. As can best be seen in FIG. 4, the X drive motor 96 is coupled over the belt 92 for turning the screw 94 that extends along the length of the bottom drive and guide assembly 46. The screw 94 is journaled at its ends on bearings 138, 140. As can best be seen in FIG. 5, the tower 44 is mounted to a carriage 142 via a resilient member schematically illustrated in dashed line 144 that provides vibration isolation. The carriage 142 has a U-shaped screw follower portion 145. The screw follower 145 is coupled to the screw via resilient shock mounts 146 that compensate for any longitudinal warping along the screw 94. The carriage 142 includes a support portion 148 that rides along a linear ball bearing 150 that extends along the bottom drive and guide rail 46. The tower is controllably moved in response to turning of the screw 94 and its weight is supported on the linear ball bearing 150. Any warping or vibration produced in movement is absorbed by the rubber shock mounts 146 and rubber pads 144 which act to decouple any movement-induced vibration from the transported quartzware and wafers.

Figures 6, 7:
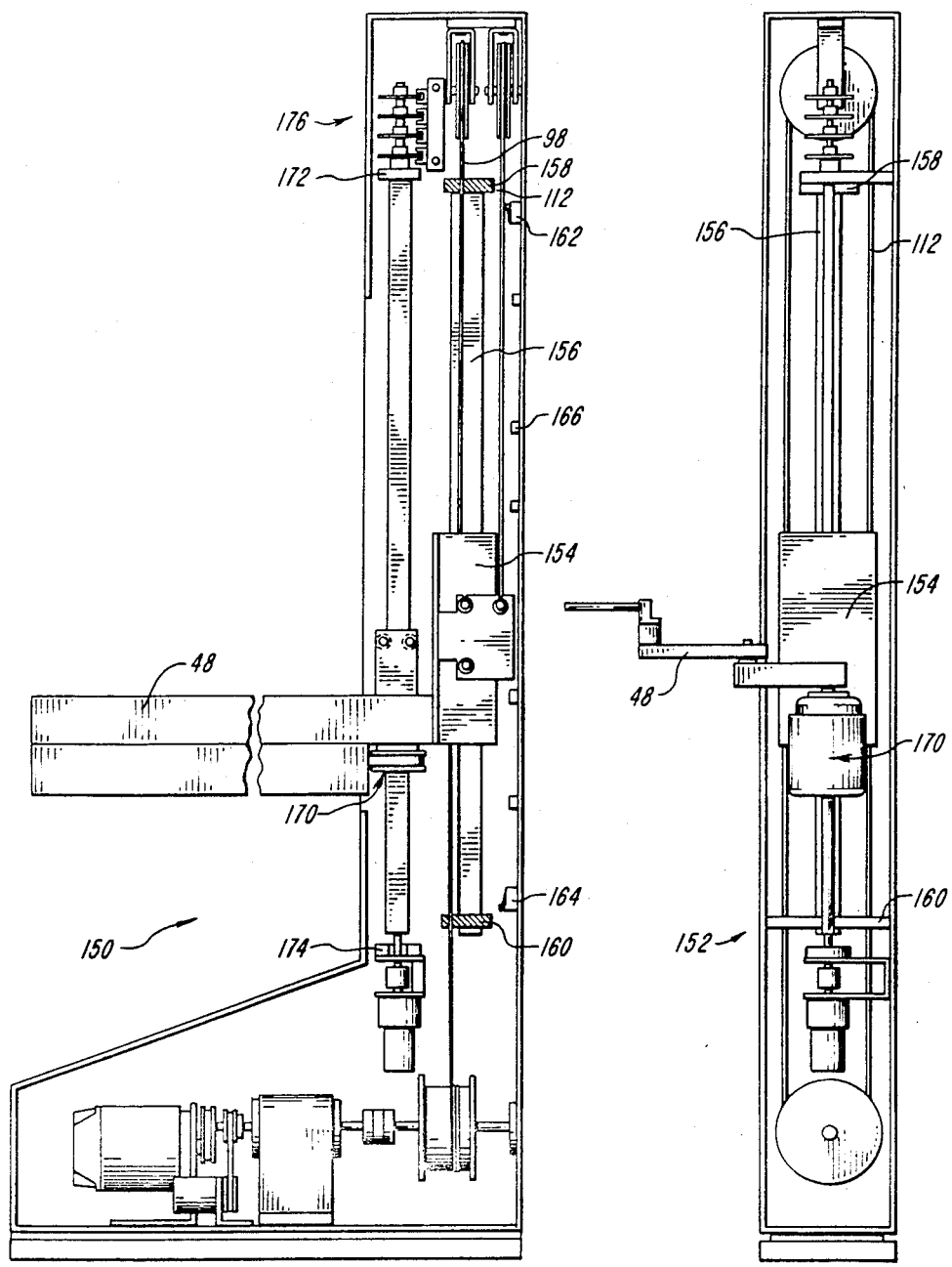
FIG. 6 is a side pictorial view illustrating the Z assembly and linkage of the boat transfer and queuing furnace elevator and method according to the present invention.
FIG. 7 is a pictorial end elevational view illustrating the Z actuator and linkage of the boat transfer and queuing furnace elevator and method according to the present invention.

Referring now to FIGS. 6 and 7, generally designated at 150 in FIG. 6 is a side elevational view and generally designated at 152 in FIG. 7 is an end elevational view illustrating the Z drive assembly of the boat transfer and queuing furnace elevator according to the present invention. The arm 48 is fastened to a slide 154 that is mechanically tied to the cables 98, 112. The slide 154 is slideably mounted on a linear bearing 156 that is fastened at its ends to the tower 44 as by plates 158, 160.

Upper and lower limit switches 162, 164 are mounted to the tower 44 and provide signal indications of the limit of slide 154 travel along the Z axis. Optical switches schematically illustrated at 166 are mounted to the tower 44 for providing signal indications of travel along the Z axis useful for stopping at intended tube load and unload shelf locations during controlled transfer and queuing movement. The queuing and transfer shelf locations are determined by the Z motor shaft encoder.

The axially extending arm 48 is mounted in a journaled sleeve generally designated 170 to be described for sliding motion on the flat bar 130 along the Z axis. The flat bar 130 is journaled on its ends on bearings 172, 174 respectively fastened to the tower 44. A plurality, preferably four, of optical switches with disc mounted actuators generally designated 176 are mounted for rotation with the top of the flat bar 130. The optical switches 176 provide signal indications of the angular orientation of the flat bar for determining the lateral position of the lateral arm assembly mounted to the arm 48 during controlled transfer and queuing.

Figure 8:
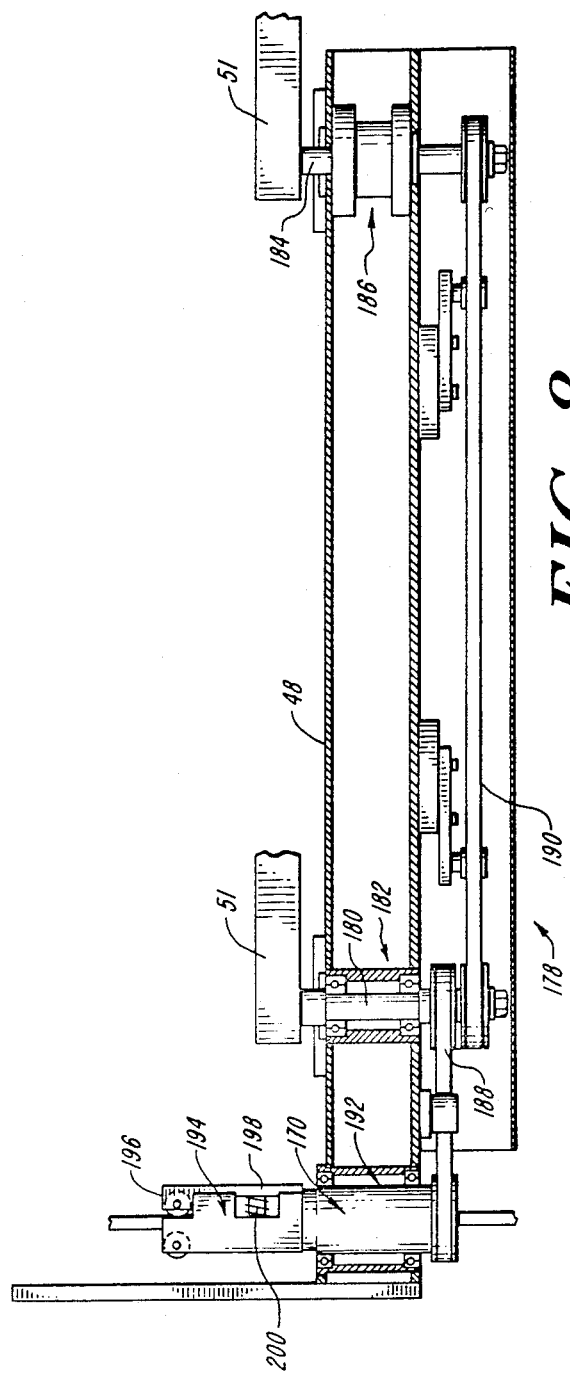
FIG. 8 is a sectional elevational view illustrating the Y assembly and linkage of the boat transfer and queuing furnace elevator and method according to the present invention.

Referring now to FIG. 8, generally designated at 178 is an elevational view of the lateral arm drive assembly of the boat transfer and queuing furnace elevator according to the present invention. An inboard shaft 180 is mounted in bearings generally designated 182 for pivoting motion about the arm 48. An outboard shaft 184 is similarly mounted in bearings, not shown, for pivoting motion about the arm 48. The bearings are mounted in an eccentric housing generally designated 186 that allows positioning adjustment of the shaft 184 to allow for smooth swinging motion of the lateral arm assembly. The shaft 180 extends below the arm 48 and is controllably rotated by a belt 188. The shaft 184 extends below the bottom of the arm 48, and a belt 190 couples the rotation imparted by the drive belt 188 to the outboard shaft 184 for rotating same.

The sleeve 170 is journaled through the arm 48 as by bearings generally designated 192. The drive belt 188 is mounted for rotation with the sleeve 170. A resilient coupling generally designated 194 is mounted for rotation with the member 170. The coupling 194 includes plastic or rubber coated rollers 196 mounted on arms 198 that are biased as by a sring 200 into contact with the flat bar 130 as can best be seen in FIG. 9. The plastic or rubber covered rollers and the resilient bias imparted thereto by the spring 200 cooperate to provide vibration isolation during controlled rotation of the flat bar 130 for movement of the fingers 52 (FIG. 1) along the Y axis.

Figure 10:
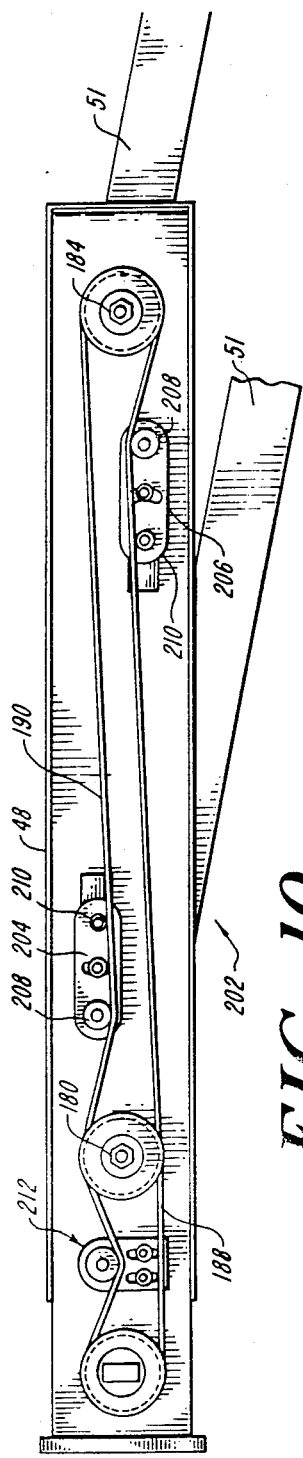
FIG. 10 is a bottom plan view of the Y assembly and linkage of the boat transfer and queuing furnace elevator and method according to the present invention.

Referring now to FIG. 10, generally designated at 202 is a bottom plan view of the lateral drive assembly of the boat transfer and queuing furnace elevator according to the present invention. The belt 190 during rotation between the shafts 180, 184 bears on its outside surface against an adjustable tensioning device 204 and against an adjustable tensioning device 206. The tensioning devices 204, 206 each include rollers 208 mounted to a plate 210 that is selectively movable along the Y and X axes for imparting a preselected tension to the belt 190. The tension is selected to provide phase angle stability for the linkage when the lateral assembly swings through the X axis between outboard and inboard positions thereof to be described. A movable belt tensionsing assembly generally designated 212 is mounted for sliding movement to the bottom of the arm 48 for selectively tensioning the belt 188.

Referring now to FIG. 11, generally designated at 214, 216 in FIG. 11A and at 218 in FIG. 11B are plan views illustrating the controlled movement of the lateral arm assembly along the Y axis. As appears more fully below, the position generally designated 214 and illustrated in dashed outline in FIG. 11A corresponds to the laterally outermost position of the arm useful for the embodiment of FIG. 2, while the position generally designated 216 and illustrated in solid outline in FIG. 11A represents the inboard position of the arm assembly for picking up and dropping down the intermediate carrier during operation of the both the embodiments of FIG. 1 and FIG. 2 to be described. The position generally designated 218 and illustrated in solid outline in FIG. 11B represents the position of the arm assembly in its "home" position to be described.

Figure 12:
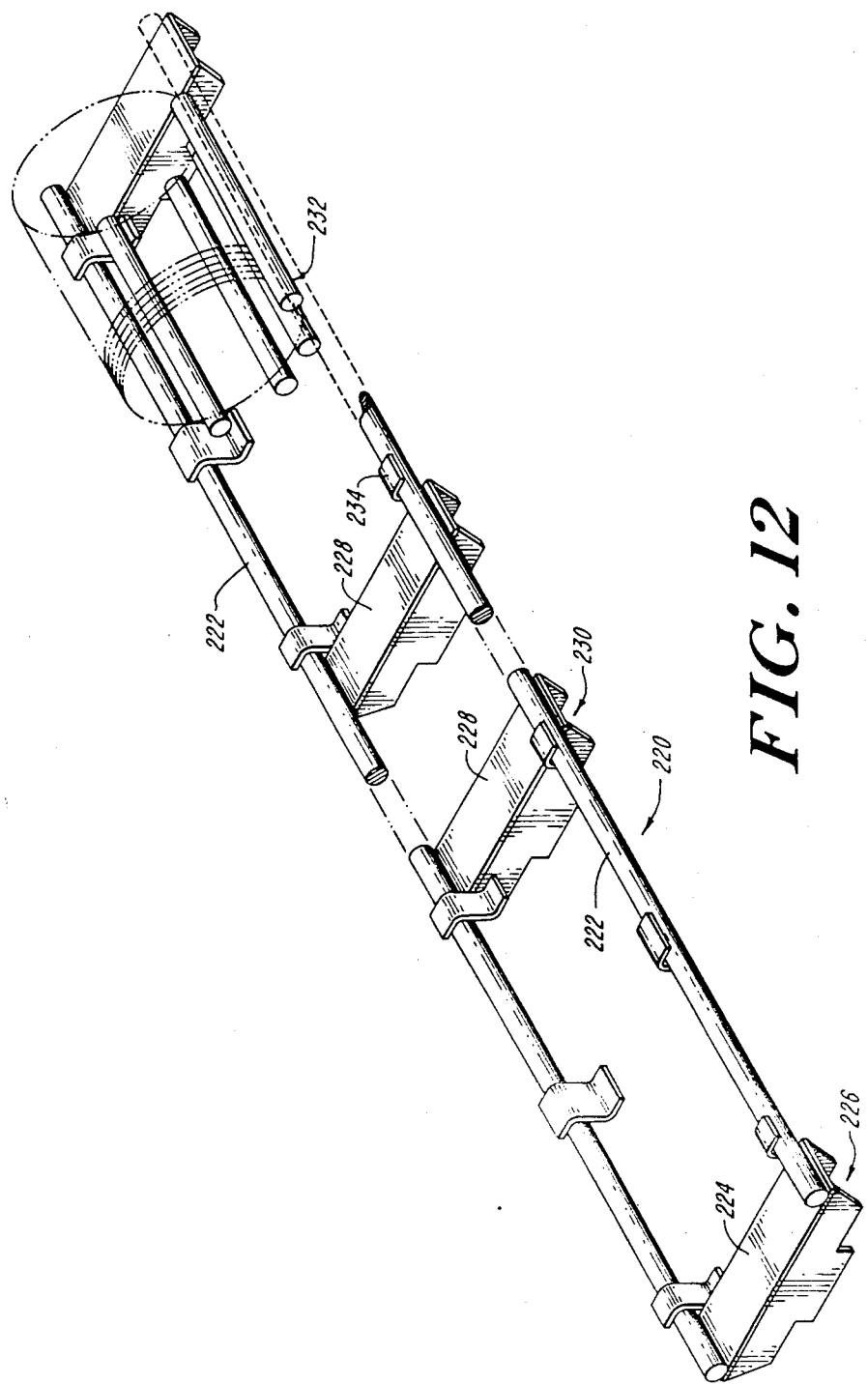
FIG. 12 is an isometric view illustrating an intermediate carrier that cooperates with the Y assembly of FIG. 11 of the boat transfer and queuing furnace elevator and method according to the present invention.

Referring now to FIG. 12, generally designated at 220 is a perspective view illustrating an intermediate carrier of the boat transfer and queuing furnace elevator according to the present invention. The intermediate carrier 220 includes longitudinally extending side rails 222 fastened at their longitudinal ends by Ushaped walls 224 defining finger receiving openigns generally designated 226. The side rails 222 are fastened at points intermediate their ends by U-shaped walls 228 likewise defining finger receiving openings generally designated 230. Plural fourrail wafer receiving boats generally designated 232 are slidably positioned in the innerspace defined between the side rails 222 and are longitudinally located by positioning and support tabs 234 provided at selected stop and support points along the length of the side rails 222. The intermediate carrier in the presently preferred embodiment is capable of receiving six wafer-loaded boats, and is preferably fabricated of quartz or other refractory material.

The boat transfer and queuing furnace elevator system in both embodiments is capable of controlled movement in several modes that significantly increase system flexibility and system capability and accommodate the demand for efficient transfer to improve the system throughput capability. There are preferably six basic modes of operation. A first is called load-to-tube, where the elevator is able to pick up a group of wafers in boats pre-loaded on an intermediate carrier and placed on the loading shelf for controlled movement to any desired furnace tube paddle location.

A second mode is called load-to-queue, where the elevator is able to pick up an intermediate carrier off the loading shelf and place it on any one of the transfer queuing shelves.

Another mode is called queue-to-tube, where the elevator is able to mov a load of wafers from any one of the transfer queuing shelves and place it on any desired furnace tube paddle.

A further mode is called tube-to-unload, where the elevator is able to pick up a wafer load from any furnace paddle and place it on the unloading shelf in the work station.

A further mode of operation is called recall-from-queue, where the elevator is able to controllably move a previously queue load on a selected queue shelf back to the loading shelf for redirection to another furnace tube or queue shelf. This mode is useful, for example, to help correct any operator errors.

Another mode is called pause-after-unload, where, unlike the above described modes, the elevator is able if an operator command is keyed during a predetermined time interval after a load is placed on the unload shelf to immediately commence a new cycle without the first going to its "home" position to be described. This mode helps improve the system throughput and overall efficiency by reducing the overall cycle time for unload/load or unload/queue cycle combinations.

Figure 13A:
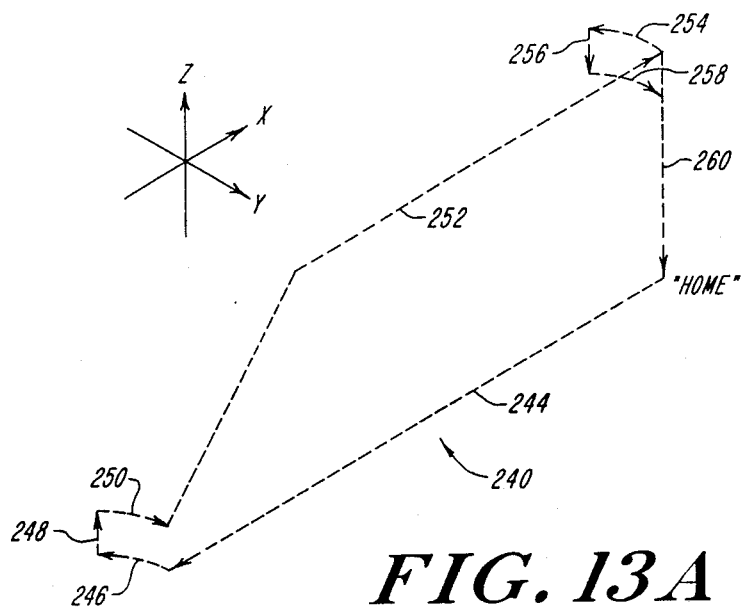
FIG. 13 is a schematic pictorial diagram illustrating in FIGS. 13A and 13B the principal of movement of the first embodiment of the boat transfer and queuing furnace elevator and method according to the present invention.
Figure 13B:
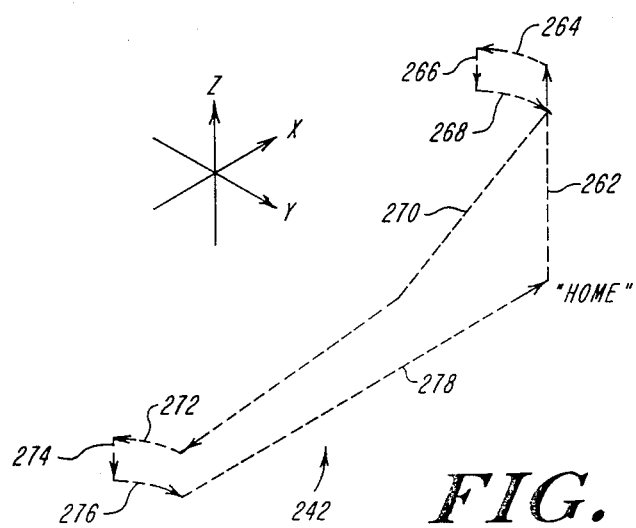

In operation and referring now to FIG. 13, generally designated at 240 in FIG. 13A is a pictorial diagram useful in explaining the load cycle and generally designated at 242 in FIG. 13B is a pictorial diagram useful in explaining an unload cycle for the FIG. 1 embodiment of the boat transfer and queuing furnace elevator according to the present invention. The elevator 42 (FIG. 1) has a "home" position from which its load, unload, and transfer operations typically are initiated and terminated for each mode of its operation except the pause-after-unload mode. In presently preferred embodiment, the "home" position is defined at an X position "$X_1$" adjacent the furnace, at a Z position "$Z_1$" at the lowest vertical point adjacent the furnace, and at a Y position "$Y_2$" (designated 218 in FIG. 11B) where the fingers 52 are free of the loading station. The elevator has an additional X position "$X_2$" confronting the work station 26, and ten vertical positions "$Z_2$ $Z_{11}$" that respectively represent the vertical coordinates of the four tube positions and corresponding loading mechanisms and the vertical coordinates of the six vertical positions of the shelves of the work station. The elevator also defines an inboard lateral position "$Y_1$" (designated 216 in FIG. 1A0 at which the fingers engage the corresponding openings provided therefor in the intermediate carriers.

The pictorial diagram 240 of FIG. 13A illustrates a typical load sequence. The diagram depicts the controlled movement of the elevator in the load-to-tube mode, but it will be appreciated that the movement for the other modes will be similar except for different starting and stopping locations, not specifically illustrated for brevity of explication.

As designated by a dashed line 244, the elevator with its lateral arm in its non-interferring position "$Y_2$" moves simultaneously in X and Z to the load shelf position. As illustrated by a dashed line 246, the elevator then moves in Y from its outboard position "$Y_2$" to its inboard position "$Y_1$" in such a way that the fingers are received in the openings provided therefor in the intermediate carrier. As shown by a dashed line 248, the elevator then moves in Z vertically approximately one and one half inches to pick up the load. As shown by a dashed line 250, the elevator then moves the lateral arm outwardly from it inboard position "$Y_1$" to its outboard position "$Y_2$" to clear the shelf. As shown by a dashed line 252, the elevator then moves simultaneously in X and in Z to the desired tube position. As shown by a dashed line 254, the elevator then swings in from its outboard position "$Y_2$" to its inboard position "$Y_1$" over the paddle of the selected load station. As shown by a line 256, the elevator then decends in Z vertically to place the load on the paddle. As shown by a dashed line 258, the elevator then swings laterally outwardly from its inboard position "$Y_1$" to its laterally outward position "$Y_2$" to clear the paddle, and as shown by a dashed line 260 the elevator then decends to its "home" position.

The unload cycle generally designated 242 in FIG. 13B is similar to the above described load cycle but is in reverse. As shown by a dashed line 262, the elevator rises from its home position to the height of the selected tube and swings in to acquire the load as shown by a dashed line 264. It then rises as shown by a dashed line 266 to elevate the load above the paddle, and swings out to clear the paddle as shown by a dashed line 268. It then moves simultaneously in X and Z to the designated unload shelf position as shown by a dashed line 270. It then swings in above the shelf from its outboard position to its inboard position as shown by a dashed line 272, and then moves vertically downwardly to place the load on the shelf as shown by a dashed line 274. It then swings laterally outwardly to clear the shelf as shown by a dashed line 276 and thereafter moves simultaneously in X and Z to the home position as shown by a dashed line 278.

Figure 14A:
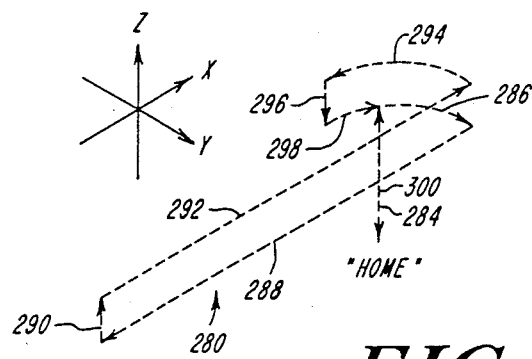
FIG. 14 is a schematic pictorial diagram illustrating in FIGS. 14A and 14B the principal of movement of the second embodiment of the boat transfer and queuing furnace elevator and method according to the present invention.
Figure 14B:
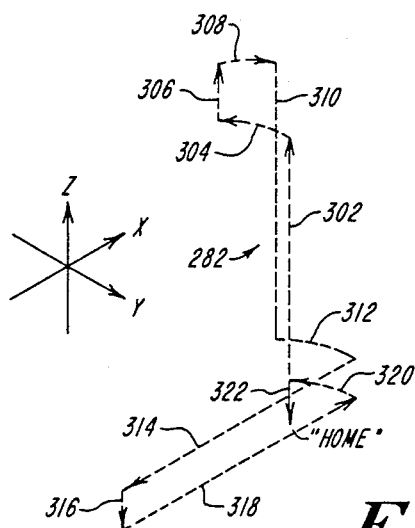

Referring now to FIG. 14, generally designated at 280 in FIG. 14A and generally designated at 282 in FIG. 14B are pictorial diagrams useful in explaining the operation of the FIG. 2 embodiment of the boat transfer and queuing furnace elevator according to the present invention. As above-described, the FIG. 2 embodiment differs from the FIG. 1 embodiment insofar as the work station is laterally positioned rather than in-line with the furnace so as to better conserve clean-room real estate. The offset elevator embodiment also differs in that it has two, rather than four, transfer queuing shelves that are axially aligned at the same vertical location as the corresponding paddle positions of the load station. The lateral arm assembly positions in Y include an inboard position "$Y_1$" (designated 216 in FIG. 11A) for loading and off-loading off of the paddles of the load station, a neutral position "$Y_2$" (designated 218 in FIG. 11B) where it remains in the "home" position, and an outboard position "$Y_3$" (designated 214 in FIG. 11A) for loading and off-loading off of the shelves of the work station. The offset elevator embodiment has two axial positions designated "$X_1$" and "$X_2$" like in the FIG. 1 embodiment. The offset elevator embodiment has five vertical positions including the "home" position and four vertical positions "$Z_2$ - $Z_5$" corresponding to the positions of the combined tube/shelf positions. The offset elevator embodiment is also operable in the several modes described above.

FIGS. 14A, 14B illustrate exemplary movement patterns for the load-totube mode and for the tube-to-unload mode respectively, the movement patterns for the other modes being similar and not specifically illustrated for brevity of explication. As shown by a dashed line 284 in FIG. 14A, the elevator rises in Z from its home position upwardly to the selected shelf height location. As shown by a dashed line 286, the elevator then swings laterally outwardly to that Y position "$Y_3$" where it is axially aligned with the Y position of the selected shelf. As shown by a dashed line 288, the elevator then moves through the clearance under the shelf provided therefor (designated 84 in FIG. 2) to the load position from the X coordinate "$X_1$" of its "home" position to the X axial coordinate of the shelf position "$X_2$". As shown by a dashed line 290, the elevator then moves vertically upwardly with the fingers 52 (FIG. 1) thereof moving through the slots provided therefor in the selected shelf to pick up the intermediate carrier positioned thereon. As shown by a dashed line 292, the elevator then moves axially from its "$X_2$" X axis position to the axial coordinate "$X_1$" of its "home" position but at the height of the corresponding load shelf of the load island. As shown by a dashed line 294, the elevator then swings laterally inwardly above the corresponding paddle from its laterally outbound position "Y$_3$" to its inboard position "Y$_1$". As shown by a dashed line 296, the elevator then vertically decends to place the load on the corresponding paddle. As shown by a line 298, the arm then laterally swings outwardly to its neutral position "Y$_2$" and decends to the "home" position as shown by a line 300.

The exemplary movement pattern for unloading the intermediate carrier off a corresponding paddle to the unload shelf of the work station is designated at 282 in FIG. 14B. As shown by a dashed line 302, the elevator first moves vertically along the Z axis from its "home" position to the height that corresponds to the tube to be unloaded. As shown by a dashed line 304, the elevator then laterally swings inwardly from its neutral position "Y$_2$" to its inbound position "Y$_1$" to acquire the load. As shown by a dashed line 306, the elevator then rises vertically to lift the load from the corresponding paddle. As shown by a dashed line 308, the elevator then swings laterally outwardly from its inboard position "Y$_1$" to its neutral position "Y$_2$". As shown by a dashed line 310, the elevator then vertically decends to the vertical location of the unload shelf. As shown by a line 312, the elevator then laterally swings outwardly in Y from its neutral position "Y$_2$" to its outboard position "Y$_3$" and then moves axially through the clearance above the shelf provided therefor (designated 82 in FIG. 2) to the location of the unload shelf along the X axis from its inboard position "X$_1$" to its outboard position "X$_2$. As shown by a dashed line 316, the elevator then vertically decends in Z to place the load on the unload shelf a sufficient distance so that the fingers are located beneath the unload shelf. As shown by a dashed line 318, the elevator than moves axially through the clearance below the shelf provided therefor to the inboard X axis location "X$_1$". As shown by a dashed line 320, the elevator then swings in from its outboard position "Y$_3$" to its neutral position "Y$_2$" and the decends back to the home position as shown by a dashed line 322.

It will be appreciated that many modifications of the presently disclosed invention will become apparent to those skilled in the art without departing from the scope of the appended claims.

What is claimed is:

1. A high-output, multiple-processing semi-conductor processing system providing transfer and queuing of selected ones of whole furnace loads of boat-loaded wafers all at once to and from any selected one of a plurality of boat-loading mechanisms that are each operatively associated with a corresponding one of plural semiconductor processing furnace tubes of a semiconductor processing furnace in such a way that the several mechanisms and tubes respectively are axially aligned, comprising:

a work station at which a furnace load of semiconductor wafers as a whole are temporarily deposited for subsequent transfer to boat-loading mechanisms for processing in a selected furnace tube, at which a furnace load of already processed semiconductor wafers as a whole are temporarily deposited from said boat-loading mechanisms after processing in a selected furnace tube, and at which each of one or more furnace loads of semiconductor wafers as a whole are temporarily queued while being transferred between several furnace tubes during multiple-processing;

said work station including one or more intermediate transfer shelves upon which said wafers are queued during transfer, a loading shelf upon which said wafers are deposited for transfer to a selected furnace tube, and an unloading shelf upon which said wafers are deposited after processing in selected ones of the furnace tubes;

said work station being stationed at a work station position selected in relation to said boat-loading mechanisms of the several furnace tubes so as to provide unobstructed operative transfer pathways therebetween;

means for transferring as a whole any one of said furnace loads of wafers between any one of said boat-loading mechanisms and any one of said shelves of said work station along said pathways, said transferring means including a body having a tower upstanding along a Z axis, an arm extending from the tower along an X axis and a frame attached to the arm, said frame having fingers extending along a Y axis for engaging a furnace load of wafers to be moved as a whole between said work station and said boat loading mechanisms, wherein said X axis is parallel to said axial alignment of said boat loading mechanism, said Y axis is horizontally perpendicular to said X axis and said Z axis is mutually orthogonal to said X and Y axis;

means coupled to said body for controllably providing access of said fingers to a plurality of stopping positions along a first range of said X axis, said first range defined at least between the X coordinates of said boat-loading mechanisms and the X coordinate of said position of said work station; said means coupled to said body further for controllably providing access of said fingers to a plurality of stopping positions along a second range of said Y axis, said second range of at least defined between the Y coordinates of said boat-loading mechanisms, the Y coordinates of said work station position, and the Y coordinates of the X axis, said means coupled to said body further for controllably providing access of said fingers to a plurality of stopping positions along a third range of said Z axis, said third range at least defined by the Z coordinates of said boat-loading mechanisms and by the Z coordinates of said shelves of said work station:

said controllably providing access means including an X drive sub-assembly;

said X-drive sub-assembly including an X-drive motor mounted at a Z coordinate below said third range of said Z axis to keep X-drive motor generated pollution below said operative transfer pathways; and an X-linkage coupled between said X-drive motor and said body for providing access of said fingers to any selected X coordinate of said first range of said X axis;

said controllably providing access means further including:

a Z-drive sub-assembly;

said Z-drive sub-assembly including a Z drive motor mounted at a Z coordinate below said third range of said Z axis to keep Z-drive motor generated pollution below said operative transfer pathways; and a Z-linkage coupled between said body and said Z-drive motor for providing access of said fingers to any selected Z coordinate of said third range of said Z axis; and said controllably providing access means further including a Y-drive sub-assembly;

said Y-drive sub-assembly including a Y-drive motor mounted at a Z coordinate below said third range of said Z axis to keep Y-drive motor generated pollution below said operative transfer pathways; and a Y-linkage coupled between said Y-drive motor and said body for providing access of said fingers to any selected Y-coordinate of said second range of said Y axis, said Y-linkage including a flat bar journaled in said arm and coupled to said Y drive motor, and means for moving said fingers along said Y axis coupled between said flat bar and said frame having fingers.

2. The system of claim 1, wherein the means coupled between said flat bar and said frame having fingers includes a sleeve rotatable with said flat bar and a linkage for pivoting said frame having fingers along said Y axis coupled between said sleeve and said frame having fingers.

3. The system of claim 2, wherein said linkage for pivoting said frame having fingers along said Y axis includes a parellelogram linkage.

4. The system of claim 2, wherein a vibration-damping means is mounted between said sleeve and said flat bar.

5. The system of claim 4, wherein said vibration-damping means includes resilient-coated and spring-biased rollers, and means for engaging said rollers with said flat bar.

* * * * *

UNITED STATES PATENT AND TRADEMARK OFFICE
CERTIFICATE OF CORRECTION

PATENT NO. : 4,872,799

DATED : October 10, 1989

INVENTOR(S) : Daniel J. Fisher, Jr.

It is certified that error appears in the above-identified patent and that said Letters Patent is hereby corrected as shown below:

In Column 8, line 26, "ends by Ushaped" should read --ends by U-shaped--.

In Column 8, line 56, "able to mov a" should read --able to move a--.

In Column 9, line 32-33, "FIG. 1AO" should read --FIG.11A)--.

In Column 10, line 46, "the load-totube" should read --the load-to-tube--.

In Column 11, line 39, "and the decends" should read --and then descends--.

Signed and Sealed this

Twenty-eighth Day of April, 1992

*Attest:*

HARRY F. MANBECK, JR.

*Attesting Officer*     *Commissioner of Patents and Trademarks*